US012684943B2

(12) United States Patent
Lee et al.

(10) Patent No.: US 12,684,943 B2
(45) Date of Patent: Jul. 14, 2026

(54) DISPLAY APPARATUS AND METHOD FOR MANUFACTURING DISPLAY APPARATUS

(71) Applicant: LG Display Co., Ltd., Seoul (KR)

(72) Inventors: Junjae Lee, Paju-si (KR); Chanhyeok Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 478 days.

(21) Appl. No.: 17/874,039

(22) Filed: Jul. 26, 2022

(65) Prior Publication Data

US 2023/0217703 A1    Jul. 6, 2023

(30) Foreign Application Priority Data

Dec. 30, 2021    (KR) ........................ 10-2021-0192682

(51) Int. Cl.
    *H10K 59/80*      (2023.01)
    *H10K 50/87*      (2023.01)
    *H10K 59/12*      (2023.01)

(52) U.S. Cl.
    CPC ............. *H10K 50/87* (2023.02); *H10K 59/80* (2023.02); *H10K 59/12* (2023.02); *H10K 59/871* (2023.02)

(58) Field of Classification Search
    CPC .... H10K 50/87; H10K 50/841; H10K 50/842; H10K 59/871; H10K 59/872; H10K 50/80; H10K 50/88; H10K 59/80; H10K 77/00; H10K 59/12; H10K 59/131; H10K 59/1315; H10K 59/8794; H10K 59/00; G02F 2202/22
    See application file for complete search history.

(56) References Cited

U.S. PATENT DOCUMENTS

| | | |
|---|---|---|
| 10,535,835 B2 | 1/2020 | Han |
| 11,048,306 B2 | 6/2021 | Kwak et al. |
| | (Continued) | |

FOREIGN PATENT DOCUMENTS

| | | |
|---|---|---|
| CN | 110865478 A | 3/2020 |
| CN | 110888261 A | 3/2020 |
| | (Continued) | |

OTHER PUBLICATIONS

Korean Intellectual Property Office, Office Action, Korean Patent Application No. 10-2021-0192682, Mar. 12, 2025, 11 pages.
(Continued)

*Primary Examiner* — Matthew C Landau
*Assistant Examiner* — David W Ward
(74) *Attorney, Agent, or Firm* — Fenwick & West LLP

(57) ABSTRACT

A display apparatus is formed with a hole in which a camera module or various sensor devices is received. The display apparatus includes a display panel, and a porous member, wherein a hole extends through the display panel and the porous member, wherein a portion of the hole extending through the display panel and a portion of the hole extending through the porous member are disposed in the same area in a plan view of the display apparatus. Accordingly, it is possible to reduce or remove the light-leakage phenomenon of the camera module, and increase the stiffness of the area around the hole of the display panel. A first coating is formed on a surface defining the hole such that an electric charge or electric field generated in the hole is discharged through the first coating.

12 Claims, 5 Drawing Sheets

(56) References Cited

U.S. PATENT DOCUMENTS

| | | | |
|---|---|---|---|
| 11,258,040 B2 | 2/2022 | Won | |
| 11,355,413 B2 | 6/2022 | Lee et al. | |
| 2006/0152905 A1* | 7/2006 | Kim | H05K 7/20963 |
| | | | 361/715 |
| 2016/0161813 A1* | 6/2016 | Lee | G02F 1/1336 |
| | | | 349/40 |
| 2017/0192134 A1* | 7/2017 | Hwang | G02B 1/16 |
| 2019/0212788 A1* | 7/2019 | Kwak | H04N 23/45 |
| 2020/0064681 A1 | 2/2020 | Son et al. | |
| 2020/0174319 A1 | 6/2020 | Chang | |
| 2020/0186688 A1 | 6/2020 | Chen et al. | |
| 2020/0328375 A1* | 10/2020 | Won | H10K 50/86 |
| 2021/0259102 A1* | 8/2021 | Shin | G06F 1/1652 |
| 2021/0263551 A1* | 8/2021 | Yee | G06F 1/1618 |
| 2021/0267079 A1 | 8/2021 | Cho et al. | |
| 2022/0271263 A1 | 8/2022 | Li et al. | |
| 2022/0310979 A1* | 9/2022 | Li | H10K 59/126 |
| 2022/0328576 A1* | 10/2022 | Huang | H10K 59/8794 |
| 2023/0354683 A1* | 11/2023 | Yang | B32B 33/00 |
| 2024/0057444 A1* | 2/2024 | Hu | H10K 59/8722 |
| 2024/0188386 A1* | 6/2024 | Zhang | H10K 59/8794 |

FOREIGN PATENT DOCUMENTS

| | | | |
|---|---|---|---|
| CN | 110955079 A | 4/2020 |
| CN | 112909069 A | 6/2021 |
| CN | 113314029 A | 8/2021 |
| CN | 113517314 A | 10/2021 |
| CN | 113629040 A | 11/2021 |
| KR | 10-2019-0011865 A | 2/2019 |
| KR | 10-2019-0084397 A | 7/2019 |
| KR | 10-2020-0083697 A | 7/2020 |
| KR | 10-2020-0120845 A | 10/2020 |
| KR | 10-2021-0086029 A | 7/2021 |
| KR | 10-2021-0109091 A | 9/2021 |

OTHER PUBLICATIONS

Chinese Nationa Intellectual Property Administration, Office Action, Chinese Patent Application No. 202210826379.6, Apr. 30, 2026, 19 pages.

* cited by examiner

DISPLAY APPARATUS AND METHOD FOR MANUFACTURING DISPLAY APPARATUS

CROSS-REFERENCE TO RELATED APPLICATION

This application claims priority from Republic of Korea Patent Application No. 10-2021-0192682 filed on Dec. 30, 2021 in the Korean Intellectual Property Office, and all the benefits accruing therefrom under 35 § U.S.C. 119, the contents of which are herein incorporated by reference in its entirety.

BACKGROUND

Field

The present disclosure relates to a display apparatus having a hole in which a camera module, etc. is disposed, and more specifically, to a display apparatus which reduces light-leakage phenomenon of the camera module and a phenomenon that an area around a hole of a display panel emits brighter light than the other areas thereof.

Description of Related Art

Various schemes and forms are used for display apparatuses that display images on TVs, monitors, smart phones, tablet PCs, and laptops.

Among the display apparatuses, a liquid crystal display apparatus (LCDs) has been used. Use and application of an organic light-emitting display apparatus (OLED) subsequent thereto are expanding.

The display apparatus includes a liquid crystal or a light-emitting element to implement an image. The apparatus includes a thin-film transistor to individually control an operation of each liquid crystal or light-emitting element such that an image is displayed on a substrate.

For example, the organic light-emitting display apparatus includes a thin-film transistor for driving a pixel and a light-emitting element that generates light upon receiving a signal from the thin-film transistor.

Smartphones, tablet PCs, and notebooks may have a camera module or various sensor devices disposed on a display apparatus thereof to take an external image or detect an external object. The various sensor devices may include at least one of a proximity sensor, an IR (infrared sensor), a gesture sensor, a color sensor, a biometric sensor, and an illuminance sensor.

The camera module or various sensor devices may be disposed under an area where the display apparatus is located, so that a bezel area as a non-display area of the display apparatus may be reduced.

Therefore, the display apparatus may have advantages in terms of a design. Feeling of immersion in the image displayed on the display apparatus may be improved.

SUMMARY

The display apparatus includes a display panel and a cushion plate. In order to place a camera module or various sensor devices in a middle of the display apparatus, a hole extending through the display apparatus may be formed in a display area.

In order to form the hole extending through a certain area of the display apparatus, the hole must be formed in the display panel and the cushion plate.

The cushion plate is formed by stacking a plurality of layers to have various functions. In order to form the hole in the cushion plate, the hole may be formed in each of the plurality of layers and then the plurality of layers may be stacked.

Further, a hole may be formed in the display panel separately from the hole formed in the cushion plate. The hole extending through the display apparatus may be formed by bonding the display panel having the hole and the cushion plate having the hole to each other.

The camera module or the sensor device may be disposed under the hole of the display apparatus or received inside the hole to photograph or detect an external object.

However, electric charges or static electricity may be generated in the hole in a process of combining the display panel and the cushion plate to each other to form the hole or in a process of removing a protective film for protecting components of each of the display panel and the cushion plate. Thus, the camera module or sensor device received in the hole may be damaged.

Further, when an electric charge or static electricity moves to an area around the hole of the display panel, a phenomenon in which the area around the hole of the display panel emits light brighter than other areas may occur.

Considering a coupling tolerance that may occur when combining the display panel and the cushion plate to each other, the hole in the cushion plate may be larger than the hole in the display panel. In this case, the area around the hole in the display panel may not be supported by the cushion plate and thus may be easily damaged by external impact.

Further, since the hole of the cushion plate is larger than the hole of the display panel, external light may pass through the display panel and enter the camera module. Thus, light-leakage phenomenon may occur, which an edge portion of an image taken from the camera module is brighter. The light-leakage phenomenon may also be caused by light incident from the display panel onto a back surface of the display apparatus.

When the hole of the cushion plate is smaller than the hole of the display panel, the coupling tolerance occurs, such that an image of an external object may be partially blocked by the cushion plate.

A purpose of the present disclosure is to reduce or remove a phenomenon in which the area around the hole of the display apparatus emits light brighter than other areas, and to prevent a camera module or various sensor devices that may be received in the hole from being damaged by an electric field.

Further, a purpose of the present disclosure is to reduce or remove the light-leakage phenomenon and to increase stiffness of the area around the hole of the display panel to prevent the display panel from being damaged.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

A display apparatus according to an embodiment of the present disclosure includes a display panel for displaying an image; and a porous member disposed under the display panel, wherein a hole is defined in the display panel and the porous member, wherein the hole extends through the display panel and the porous member, wherein a portion of the hole extending through the display panel and a portion of the hole extending through the porous member are disposed in the same area in a plan view of the apparatus.

A method for manufacturing a display apparatus according to an embodiment of the present disclosure includes bonding a display panel displaying an image and a porous member to each other via an adhesive member; and cutting the display panel and the porous member using a laser device to form a hole and a first coating on a surface of the hole.

A display apparatus according to another embodiment of the present disclosure includes a display structure including at least a display panel for displaying an image. The display apparatus also includes a cushion plate disposed under the display structure. The cushion plate may include at least a porous member formed with a plurality of pores. A hole may extend through the display structure and the cushion plate to expose a side surface of the display structure and a side surface of the cushion plate within the hole. An interface between the display structure and the cushion plate may be flush with each of the exposed side surface of the display structure and the exposed side surface of the cushion plate.

A display apparatus according to another embodiment of the present disclosure includes a display structure including at least a display panel for displaying an image. The display apparatus also includes a cushion plate disposed under the display structure. The cushion plate may include at least a porous member formed with a plurality of pores and including a conductive material. A hole may extend through the display structure and the cushion plate to expose a side surface of the display structure and a side surface of the cushion plate within the hole. A first coating may be disposed on the side surface of the display structure or on the side surface of the cushion plate. The first coating may include the conductive material.

The specific details of other embodiments are included in the detailed description and drawings.

In the display apparatus according to an embodiment of the present disclosure, the display panel and the cushion plate may be bonded to each other, and then the hole extending through the display panel and the cushion plate may be formed, thereby reducing or removing the light-leakage phenomenon, and increasing the stiffness of the area around the hole of the display panel.

Moreover, the cushion plate may include the porous member. Thus, when the hole extending through the cushion plate is formed, a metal of the porous member may melt and a hole surface may be coated with the metal.

Therefore, electrical connection from the hole of the display panel to the hole of the porous member may be established, such that the electric charge or electric field as generated in a processing of manufacturing the display apparatus may be moved to the porous member, thereby dispersing or discharging the electric charge or electric field.

Effects of the present disclosure are not limited to the above-mentioned effects, and other effects as not mentioned will be clearly understood by those skilled in the art from following descriptions.

BRIEF DESCRIPTION OF DRAWINGS

FIG. 1 is a plan view showing a front side of a display apparatus according to an embodiment of the present disclosure.

DETAILED DESCRIPTION

Figure 2:
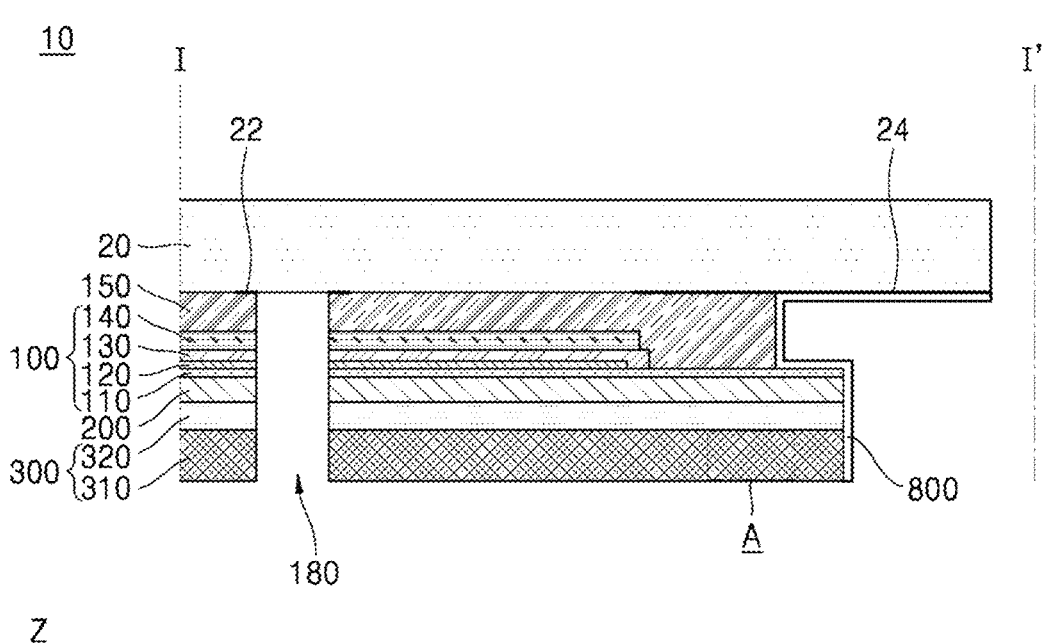
FIG. 2 is a cross-sectional view taken along I-I' in FIG. 1 according to an embodiment of the present disclosure.

Advantages and features of the present disclosure, and a method of achieving the advantages and features will become apparent with reference to embodiments described later in detail together with the accompanying drawings. However, the present disclosure is not limited to embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing an embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The display apparatus according to the present disclosure may be applied to an organic light-emitting display apparatus, but is not limited thereto, and may be applied to various display apparatuses such as an LED display apparatus or a quantum dot display apparatus.

Hereinafter, a configuration of a display apparatus according to an embodiment of the present disclosure will be described.

Figure 1:
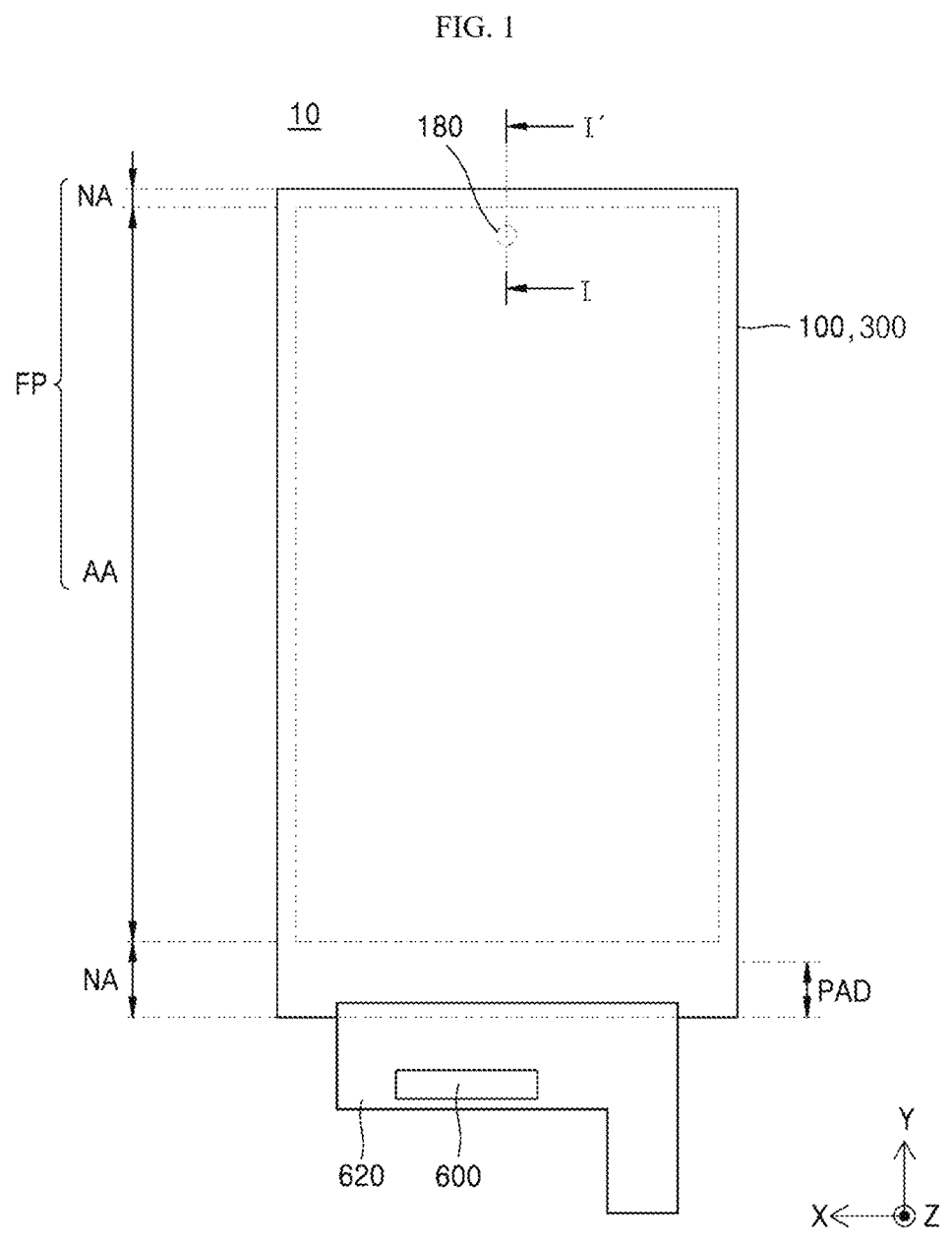

FIG. 1 is a plan view showing a front side of a display apparatus according to an embodiment of the present disclosure.

As used herein, each of frontward and upward directions may mean a Z-axis direction, and each of backward and downward directions may mean a −Z-axis direction. Moreover, an upper side, a lower side, a left side, and a right side are related to a plan view (defined by an X-axis direction and a Y-axis direction) of the display apparatus or a display panel.

Referring to FIG. 1, a display apparatus 10 may include various components such as a display panel 100 and a cushion plate 300 disposed under the display panel 100.

The display panel 100 that displays am image may include a substrate made of polymer or plastic such as polyimide (PI), or glass. The substrate may include a display area AA that displays an image and a non-display area NA that does not display an image. A pixel array may be disposed in the display area AA. The pixel array may include a plurality of sub-pixels for displaying an image and a driver circuit for driving the plurality of sub-pixels.

The non-display area NA may be an area surrounding the display area, and may be an area where no image is displayed. A bezel may refer to the non-display area surrounding the display area in a product to which the display apparatus 10 is applied. The non-display area NA and the bezel of the display apparatus 10 may be the same area.

A front portion FP of the display panel 100 may be a surface in a frontward direction, and may include the display area AA and a portion of the non-display area NA surrounding the display area AA. The front portion FP may include a first area in which the pixel array is disposed to display an image, and a portion of the non-display area NA surrounding the first area.

A lower portion of the non-display area NA of the display panel 100 may include a pad portion PAD or a bending portion.

The pad portion PAD may be connected to a driver 600 and a flexible circuit board 620, or may be connected to the flexible circuit board 620 in which the driver 600 is mounted.

There are various ways to connect the driver 600 or flexible circuit board 620 to the pad portion PAD. For example, a chip on plastic (COP) manner in which the driver 600 is directly mounted on the display panel 100, or a chip on film (COF) manner in which the driver 600 is mounted on the flexible circuit board 620 may be employed.

The flexible circuit board 620 may be directly mounted or attached to the display panel 100 in a film on plastic (FOP) manner. The connection method is not limited thereto, and various schemes may be applied.

In order to reduce the non-display area NA at a lower side of the display panel 100, a bending portion may be included. The bending portion may be located at the lower side of the non-display area NA of the display panel 100 and may be disposed between the front portion FP and the pad portion PAD.

The bending portion may be a bendable portion. The bending portion may be bent such that the pad portion PAD connected to the bending portion may be disposed under the front portion FP. The bending portion may be formed by removing some components of the display panel 100 so that the bending portion may be freely bendable.

The display panel 100 according to an embodiment of the present disclosure has a structure that may be applied to both a flexible display apparatus including the bending portion and a flat panel display apparatus not including the bending portion. The present disclosure may be applied to various display panels 100.

A hole 180 may be formed in the display area AA of the display panel 100. In the hole 180 in the display area AA, a camera module or various sensor devices may be disposed. The display panel 100 in which the hole 180 is formed according to an embodiment of the present disclosure may be of a hole in display type. However, the present disclosure is not limited to the term.

When the hole 180 is disposed in the display area AA, the camera module or various sensors may be disposed under the display area AA, so that a width of the non-display area NA may be smaller, and the apparatus has an advantage in terms of a design due to the thinner non-display area NA. Further, this may increase the feeling of immersion in the image displayed in the display area AA.

The hole 180 may be provided at a center or one side of an upper side of the display panel 100.

FIG. 2 is a cross-sectional view taken along I-I' in FIG. 1 according to an embodiment of the present disclosure.

Referring to FIG. 2, the display apparatus 10 may include a cover member 20, the display panel 100 disposed under the cover member 20, and a cushion plate 300. For example, the cushion plate 300 may be disposed under display panel 100. The cushion plate 300 may absorb the impact applied to the display panel 100 and dissipate the heat from the display panel 100 and the driver 600.

The cover member 20 may be disposed to cover a front surface of the display panel 100. The cover member 20 may protect the display panel 100 from external impact.

An edge portion of the cover member 20 may have a rounded shape formed to be curved toward a back surface thereof (−Z axis direction) on which the display panel 100 is disposed. In this case, the cover member 20 is disposed to cover at least a partial area of a side surface of the display panel 100, thereby protecting not only the front surface of the display panel 100 but also the side surface thereof from the external impact.

The image displayed on the display panel 100 may be displayed through a front surface of the cover member 20. Since the cover member 20 overlaps the display area AA that displays the image, the cover member may be made of a transparent material such as cover glass so that the image may be displayed therethrough. For example, the cover member 20 may be made of a transparent plastic material, a glass material, or a tempered glass material. The present disclosure is not limited thereto.

The front surface of the cover member 20 may include a display area AA and a non-display area NA other than the display area AA. The non-display area NA may be formed along an edge of the display area AA. The non-display area NA may refer to a bezel area. The present disclosure is not limited to the term.

The display panel 100 may be connected or coupled to a back surface of the cover member 20.

The display panel 100 may include the front portion FP, the bending portion, and the pad portion PAD. The bending portion may extend from a front surface of the display panel and may be bent. The pad portion PAD may extend from the bending portion and be disposed under the front portion FP. The driver 600 for driving a pixel may be mounted on the pad portion PAD, or a flexible circuit board 620 may be connected to the pad portion. The flexible circuit board 620 may be electrically connected to the pad portion PAD provided at a distal end of the display panel 100 via a film attaching process using a conductive adhesive layer, and may be located under the front portion FP. The conductive adhesive layer may be embodied as an anisotropic conductive film (ACF). The present disclosure is not limited thereto.

The structure of the display panel 100 is not limited thereto. In another example, the display panel 100 may be composed of the front portion FP and the pad portion PAD and may be free of the bending portion. In the display panel 100 composed only of the front portion FP and the pad portion PAD, the flexible circuit board 620 may be bent so that the driver 600 may be disposed under the display panel 100.

A connection member 150 may be disposed on the back surface of the cover member 20, and the connection member 150 may fix the display panel 100 to the cover member 20.

Since the connection member 150 may be disposed to overlap the display area AA, the connection member may be made of a transparent adhesive member. For example, the connection member 150 may be made of or include a material such as OCA (Optical Clear Adhesive), OCR (Optical Clear Resin), or PSA (Pressure Sensitive Adhesive). The present disclosure is not limited thereto.

An optical plate 140 of the display panel 100 may be disposed under the connection member 150. The optical plate 140 may have a form in which one or more function layers are stacked. However, the present disclosure is not limited thereto. For example, the optical plate 140 may include an anti-reflection layer such as a polarizing film that may prevent reflection of external light and improve outdoor visibility and contrast ratio of the image displayed on the display panel 100.

Further, the optical plate 140 may further include a barrier layer to prevent penetration of moisture or oxygen. The barrier layer may be made of a material with low moisture permeability, such as a polymer material.

The display panel 100 may include a display substrate 110, a pixel array 120 disposed on the display substrate 110, an encapsulation portion 130 disposed to cover the pixel array 120, and the optical plate 140. A touch electrode may be additionally disposed on the encapsulation portion 130.

The display substrate 110 may serve as the base substrate of the display panel 100.

The display substrate 110 may be embodied as a flexible display substrate 110 as the substrate is made of a flexible plastic material.

For example, the display substrate 110 may include polyimide as a flexible plastic material, or may be made of a glass material having flexibility.

The display substrate 110 is not limited thereto, and may be made of a glass material having a constant thickness and non-bendable.

The pixel array 120 may correspond to an area for displaying an image toward the front surface of the cover member 20, and may correspond to the display area AA.

Accordingly, an area of the cover member 20 corresponding to the pixel array 120 may be a display area AA, and an area thereof other than the display area AA may be a non-display area NA.

The pixel array 120 may be implemented in a form of various elements that display an image. The pixel array is not specifically limited.

The pixel array 120 may include a plurality of pixels disposed respectively in a plurality of pixel areas defined by signal lines on the display substrate 110 and displaying an image based on a signal supplied to the signal lines. The signal lines may include a gate line, a data line, and a pixel driving power line.

Each of the plurality of pixels has a driving thin-film transistor in the pixel area, an anode electrode electrically connected to the driving thin-film transistor, a light-emitting element layer formed on the anode electrode, and a cathode electrode electrically connected to the light-emitting element layer.

The driving thin-film transistor may include a gate electrode, a semiconductor layer, a source electrode, and a drain electrode. The semiconductor layer of the driving thin-film transistor may include silicon such as a-Si, poly-Si, or low-temperature poly-Si, or oxide such as IGZO (Indium-Gallium-Zinc-Oxide). The present disclosure is not limited thereto.

The anode electrode may be disposed in each pixel area in a corresponding manner to an opening area defined according to a pattern shape of the pixel and may be electrically connected to the driving thin-film transistor.

The light-emitting element layer may include, for example, an organic light-emitting element formed on the anode electrode. The light-emitting element may be implemented to emit light of the same color such as white light for each pixel or to emit light of a different color such as red, green, or blue for each pixel.

The cathode electrode may be commonly connected to the light-emitting elements of the light-emitting element layer disposed respectively in the pixel areas.

The encapsulation portion 130 may be formed on the display substrate 110 so as to cover the pixel array 120. The encapsulation portion 130 may prevent penetration of oxygen, moisture, or a foreign material into the light-emitting element layer of the pixel array 120. For example, the encapsulation portion 130 may be formed in a multi-layer structure in which organic material layers and inorganic material layers are alternately stacked with each other.

The display panel 100 may be divided into the front portion FP, the bending portion, and the pad portion PAD.

The front portion FP of the display panel 100 may be disposed on the side which the screen is displayed. The bending portion may be a portion that extends from the front portion FP and is bent in a downward direction. The pad portion PAD may be a portion extending from the bending portion and may be located under the front portion FP. Depending on a purpose of use of the display panel 100, the bending portion may be omitted.

The reinforcing plate 200 may be optionally disposed under the display substrate 110. When the stiffness of the cushion plate 300 disposed under the display substrate 110 is high, the reinforcing plate 200 may not be disposed. The reinforcing plate 200 may refer to a back plate. The present disclosure is not limited to the term.

The reinforcing plate 200 may be formed to have a certain strength and thickness to supplement the stiffness of the display substrate 110 and maintain the shape of the display substrate 110, and may not be formed on an area of the display panel 100 corresponding to the bending portion.

The cushion plate 300 may be disposed under the reinforcing plate 200.

The cushion plate 300 may include a porous member 310 and an adhesive member 320. The porous member 310 may be embodied as a metal foam or a porous substrate.

The porous member 310 may simultaneously perform a heat-dissipation function and an impact absorption function. The porous member 310 may be formed in a smaller thickness, such that an overall thickness and an overall size of the display apparatus 10 may be reduced.

The adhesive member 320 may be stacked on an upper surface of the porous member 310 and may have a certain thickness. The adhesive member 320 includes an adhesive component, and may attach the porous member 310 to the reinforcing plate 200 or the display panel 100.

According to an embodiment of the present disclosure, the display apparatus 10 may include the hole 180 extending through the display panel 100 and the cushion plate 300.

A camera module or various sensor devices may be received in the hole 180 and may capture an external image or detect an external object. Alternatively, the camera module or various sensor devices may be disposed below the hole 180.

When the camera module is received in the hole 180, a size of the hole 180 may be set such that the hole substantially overlaps a viewing angle of the camera module. When the sensor device is received in the hole 180, the size of the hole 180 may be set such that the sensor may be exposed to the outside. The size of the hole 180 is not limited thereto, and may be set to various sizes.

The hole 180 of the display apparatus 10 may be formed by removing a portion of each of the connection member 150, the display panel 100, and the cushion plate 300 in the same area of a plan view of the display apparatus. When the reinforcing plate 200 is disposed between the display panel 100 and the cushion plate 300, the hole may be formed by removing a portion of the reinforcing plate 200 in the same area of a plan view of the display apparatus.

Moreover, a portion of the hole 180 extending through the display panel 100, a portion of the hole 180 extending through the cushion plate 300 including the porous member 310 and the adhesive member 320, and a portion of the hole 180 extending through the reinforcing plate 200 may have the same size. The display panel 100, the cushion plate 300, and the reinforcing plate 200 are stacked vertically and then the hole 180 may be formed at once so as to extend through the display panel 100, the cushion plate 300, and the reinforcing plate 200, such that a portion of the hole 180 extending through the display panel 100, a portion of the hole 180 extending through the cushion plate 300 including the porous member 310 and the adhesive member 320, and a portion of the hole 180 extending through the reinforcing plate 200 may have the same size. In some embodiments, the hole 180 may extend through a display structure (for example, including the display panel 100 and the reinforcing plate 200) and the cushion plate 300 to expose a side surface of the display structure and a side surface of the cushion plate 300. An interface between the display structure and the cushion plate 300 may be flush with each of the exposed side surface of the display structure and the exposed side surface of the cushion plate 300. Thus, the exposed side surface of the display structure (side surface of the display panel 100 or side surface of the reinforcing plate 200) may be level or flush with the exposed side surface of the cushion plate 300 (for example, exposed side surface of the adhesive member 320).

Thus, when the display structure includes the display panel 100 without the reinforcing plate 200, an interface between the display panel 100 and the cushion plate 300 may be flush with each of the exposed side surface of the display panel 100 and the exposed side surface of the cushion plate 300 within the hole 180. When the display structure includes the display panel 100 and the reinforcing plate 200 below the display panel 100, the interface between the reinforcing plate 200 and the cushion plate 300 may be flush with each of the side surface of the reinforcing plate 200 and the exposed side surface of the cushion plate 300 within the hole 180. For example, the side surface of the reinforcing plate 200 may be level of flush with the side surface of the porous member 310 or the adhesive member 320.

A portion of the hole 180 extending through the connection member 150 disposed between the cover member 20 and the display panel 100 may have the same size as that of each of a portion of the hole 180 extending through the display panel 100, a portion of the hole 180 extending through the cushion plate 300 including the porous member 310 and the adhesive member 320, and a portion of the hole 180 extending through the reinforcing plate 200. Therefore, in some embodiments, an interface between the connection member 150 and the display panel 100 may also be flush with each of a side surface of the connection member 150 and the exposed side surface of the display panel 100 within the hole 180. Alternatively, a portion of the hole 180 extending through the connection member 150 may be formed separately. Thus, a portion of the hole 180 extending through the connection member 150 disposed between the cover member 20 and the display panel 100 may have a size different from that of each of a portion of the hole 180 extending through the display panel 100, a portion of the hole 180 extending through the cushion plate 300 including the porous member 310 and the adhesive member 320, and a portion of the hole 180 extending through the reinforcing plate 200.

The connection member 150 may be embodied as a sheet-type adhesive member and may have fluidity, and thus may flow down to the components located below the connection member 150. Further, in consideration of a connection tolerance that may occur when connecting the connection member 150 and the display panel 100 to each other, a portion of the hole 180 extending through the connection member 150 may be larger than that of each of a portion of the hole 180 extending through the display panel 100, a portion of the hole 180 extending through the cushion plate 300 including the porous member 310 and the adhesive member 320, and a portion of the hole 180 extending through the reinforcing plate 200.

Therefore, the hole 180 extending through the connection member 150, the display panel 100, and the cushion plate 300 may be formed in a cylindrical shape with a constant diameter as it extends vertically. Alternatively, the hole 180 extending through the connection member 150, the display panel 100, and the cushion plate 300 may be formed in a cylindrical shape having a step such that a top diameter is larger than a bottom diameter. The shape of the hole 180 is not limited thereto, and the hole 180 may also be formed in a polygon shape in a plan view:

Since the connection member 150 is made of a transparent material, an image of an external object or light may be incident to the camera module regardless of the size of the portion of the hole 180 extending through the connection member 150.

However, the display panel 100 is made of a non-transparent material. Thus, when the hole 180 extending through the display panel 100 is smaller than the viewing angle of the camera module, a portion of the image of the external object or light is incident on the camera module through the display panel 100 such that an edge portion of the image captured by the camera module may appear dark.

Moreover, when the hole 180 extending through the display panel 100 is larger than the viewing angle of the camera module, external light from an area out of the viewing angle of the camera module may be incident into the hole 180 of the display apparatus 10. The light incident into the hole 180 of the display apparatus 10 may be reflected from the side surface of the display panel 100 and the side surface of the cushion plate 300 and then may be incident on the camera module. Thus, the light-leakage phenomenon that the edge portion of the image taken with the camera module is brighter may occur.

Further, as the hole 180 extending through the display panel 100 increases, a size of an area where the image is not displayed increases, so that the image expression becomes unnatural. This may also cause a disadvantage in terms of a design.

Therefore, it is necessary to set the size of the hole 180 extending through the display panel 100 in consideration of the viewing angle of the camera module.

Further, when the display panel 100 includes an organic light-emitting diode OLED, the light generated from the organic light-emitting diode OLED may be emitted to the back surface of the display panel 100 and may be directly incident on the camera module. Specifically, since the light generated from the area around the hole 180 of the display panel 100 is directly incident to the camera module, the edge portion of the image photographed by the camera module may be presented darker or brighter than the actual image may be presented. Therefore, it is necessary to set the size of the hole 180 extending through the display panel 100 in consideration of the viewing angle of the camera module.

A size of a portion of the hole 180 extending through the cushion plate 300 disposed under the display panel 100 may be the same as a size of a portion of the hole 180 extending through the display panel 100.

When a size of a portion of the hole 180 extending through the cushion plate 300 disposed under the display panel 100 is smaller than a size of a portion of the hole 180 extending through the display panel 100, a portion of the hole 180 extending through the display panel 100 may be partially blocked with the cushion plate 300 due to the connection tolerance occurring when the cushion plate 300 is connected to the display panel 100.

Therefore, the size of the portion of the hole 180 extending through the display panel 100 may be the same as or larger than the size of the portion of the hole 180 extending through the cushion plate 300. When the size of the portion of the hole 180 extending through the cushion plate 300 is larger than the size of the portion of the hole 180 extending through the display panel 100, external light may pass through the area around the hole 180 extending through the display panel 100. External light passing through the display panel 100 may be reflected continuously inside the hole 180 and may be incident on the camera module. This may cause the light-leakage phenomenon.

Moreover, when the size of the portion of the hole 180 extending through the cushion plate 300 is larger than the size of the portion of the hole 180 extending through the display panel 100, the area around the portion of the hole 180 extending through the display panel 100 is not supported with the cushion plate 300. In this case, the cushion plate 300 may not absorb the external impact and thus the area around the portion of the hole 180 extending through the display panel 100 may be damaged.

Therefore, the size of the portion of the hole 180 extending through the display panel 100 and the size of the portion of the hole 180 extending through the cushion plate 300 are equal to each other, such that the image quality taken from the camera module may be improved, and damage to the area around the portion of the hole 180 extending through the display panel 100 due to the external impact may be prevented.

For example, the display panel 100 and the cushion plate 300 including the porous member 310 may have the hole 180 extending therethrough in the same area of a plan view of the display apparatus. The size of the portion of the hole 180 extending through the display panel 100 and the size of the hole 180 extending through the cushion plate 300 may be equal to each other.

A first light-blocking portion 22 may be disposed on a portion of the back surface of the cover member 20 corresponding to the area around the hole 180 extending through the display panel 100 so as to surround the hole 180.

The first light-blocking portion 22 may prevent a signal line, etc., disposed in the area around the portion of the hole 180 extending through the display panel 100 from being viewed to the outside, and may prevent the external light from being incident into the display apparatus 10.

Further, when the external light is incident in an oblique direction of the display panel 100, the external light may be incident into between the camera module and the display panel 100, and thus the light-leakage phenomenon may occur in the camera module. Accordingly, the first light-blocking portion 22 may be disposed to prevent the external light from being incident in the oblique direction of the display panel 100.

The first light-blocking portion 22 may be formed by applying black ink. The first light-blocking portion 22 may include an electrically conductive material, and thus may have conductive properties such that electric charges may move.

A second light-blocking portion 24 may be formed on four sides of the edge of the cover member 20. The second light-blocking portion 24 may prevent various components disposed under the cover member 20 from being viewed to the outside, and may block external light from being incident into the display apparatus 10.

The second light-blocking portion 24 may be formed on the back surface of an edge of the cover glass 164. In the similar manner to the first light-blocking portion 22, the second light-blocking portion 24 may be formed by applying the black ink. The second light-blocking portion 24 may include an electrically conductive material, and thus may have conductive properties.

In order to discharge the electric charge or electric field generated on the side surfaces of the cover member 20 and the display panel 100, the second light-blocking portion 24 (or the back surface of the cover member 20) and the porous member 310 of the cushion plate 300 may be connected to each other via a discharge member 800. The discharge member may be composed of a film or tape including a conductive polymer compound, or may be composed of a metal sheet with high electrical conductivity. The discharge member may also be formed by coating a conductive polymer compound on the side surface of the display apparatus 10. The discharge member may be formed in various ways. The present disclosure is not limited thereto.

The second light-blocking portion 24 having the conductivity and the discharge member having the conductivity may be electrically connected to each other. The electric charge or electric field that may be generated on the surface of the cover member 20 and the side surface of the display panel 100 may move to the porous member 310 through the discharge member and thus may be discharged or dispersed.

Figure 3A:
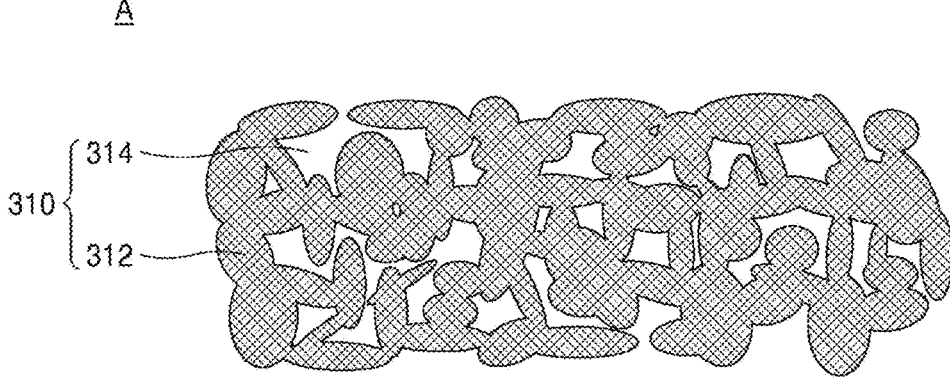
FIG. 3A is an enlarged view of an area "A" of FIG. 2 according to an embodiment of the present disclosure.

FIG. 3A is an enlarged view of an A area of FIG. 2, and is a cross-sectional view showing a porous member according to an embodiment of the present disclosure.

Figures 3B, 4:
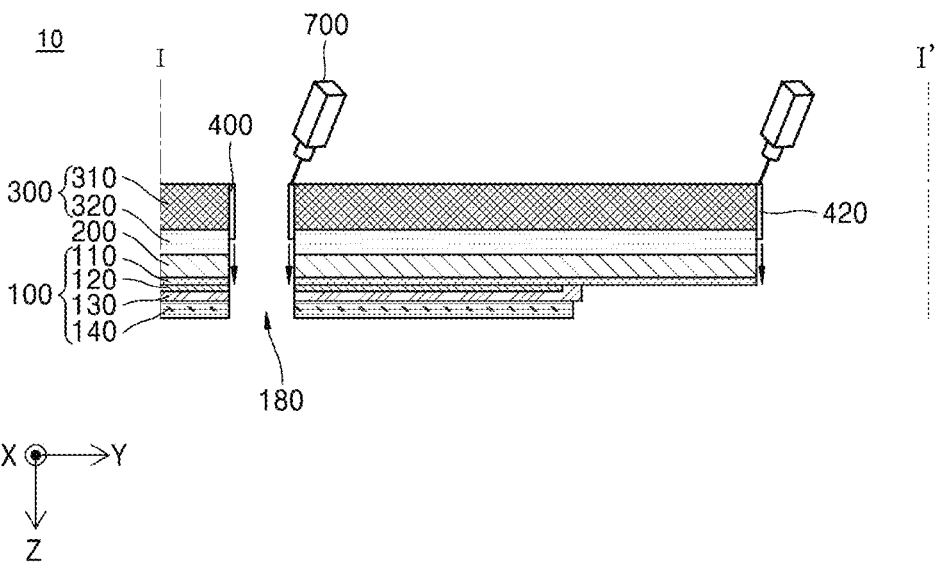
FIG. 3B is an example microscope image of a portion of the porous member of FIG. 3A.
FIG. 4 is a diagram showing a method of forming a hole in a display apparatus according to an embodiment of the present disclosure.

FIG. 3B is an example microscope image of a portion of the porous member of FIG. 3A.

Referring to FIG. 3A, the porous member 310 may be a porous metal structure including a conductive metal 312 and a plurality of pores 314 positioned inside the conductive metal 312.

Since the conductive metal 312 of the porous member 310 is made of a metal with high thermal and electrical conductivity, the porous member 310 itself may provide an excellent heat-dissipation function and charge dispersion function. Since the porous member 310 has the form of a metal structure having the plurality of pores 314 formed therein, the member 310 may also provide an excellent cushion function.

Further, since the porous member 310 includes the conductive metal 312 including the plurality of pores 314 formed therein, an overall surface area of the porous member 310 may be increased, so that the porous member 310 itself may provide a heat-dissipation function.

Therefore, the porous member 310 according to an embodiment of the present disclosure may have effective heat-dissipation function and cushion function at the same time without the need to configure a heat-dissipation layer for the heat-dissipation function and a cushion layer for the cushion function as separate layers. Moreover, since the porous member 310 has high electrical conductivity, there is no need to additionally providing the discharge layer for dispersing the charges.

Further, since there is no addition of components for heat-dissipation and/or charge discharge functions, the display apparatus may be formed to have a smaller thickness. Therefore, the overall thickness of the display apparatus may be reduced. A width of the non-display area NA may be reduced.

A porosity of the porous member 310 having the plurality of pores 314 may be in a range of 50% to 76%, and a size of each pore may be in a range of 20 μm to 30 μm. When the porosity is lower than the above range, the porous member 310 becomes heavy, and the heat-dissipation effect is lowered. Conversely, when the porosity is higher than the above range, it is difficult to maintain a desired stiffness.

The porous member 310 may be formed by sintering a metal foam precursor. The metal foam precursor refers to a structure before proceeding with a process, such as the sintering, performed to form the porous member 310.

For example, the metal foam precursor may be formed using a slurry containing a metal powder, a dispersant, and a binder.

The metal powder may be a metal powder in which one or more metal powders among a copper powder, a nickel powder, an iron powder, a SUS powder, a molybdenum powder, a silver powder, a platinum powder, a gold powder, an aluminum powder, a chromium powder, an indium powder, a tin powder, a magnesium powder, a phosphorus powder, a zinc powder, or a manganese powder are mixed, or a powder of an alloy of one or more metals, but may not be limited thereto.

The stainless steel (SUS) powder may be a metal powder in which chromium (Cr) is added to iron (Fe), and may be fine-grained iron (Fe) powder.

The copper (Cu) powder has excellent thermal conductivity, electrical conductivity, and workability, and thus may be used as a material for the porous member 310. However, due to low stiffness or elasticity, the copper powder may not be restored to its original form when an impact above a certain level is applied thereto. Therefore, the porous member 310 made of the copper (Cu) powders may be applied to the display apparatus 10 used in an environment where the impact below a certain level is applied thereto.

Moreover, when the porous member 310 is made of a composite metal (or alloy) including at least one of nickel (Ni) powder and iron (Fe) powder or stainless steel (SUS) powder, thermal conductivity, electrical conductivity, and workability thereof may be lower than those of the porous member 310 made of copper (Cu) powder, but stiffness and elasticity thereof may be increased, and thus the porous member 310 may withstand great impact. Thus, even when the impact is applied thereto, the porous member 310 may be able to restore to its original shape. The material of the porous member 310 is not limited thereto.

The dispersant may, for example, use alcohol, but may not be limited thereto.

In this case, the alcohol may use monohydric alcohol having 1 to 20 carbon atoms, such as methanol, ethanol, propanol, pentanol, octanol, ethylene glycol, propylene glycol, pentanol, 2-methoxyethanol, 2-ethoxyethanol, 2-butoxyethanol, glycerol, texanol, or terpineol, dihydric alcohol having 1 to 20 carbon atoms, such as ethylene glycol, propylene glycol, hexanediol, octanediol, or pentanediol, or polyhydric alcohol, but may not be limited thereto.

A type of the binder may not be particularly limited, and may be selected based on a type of the metal component or the dispersant used in preparing the slurry.

For example, the binder may use alkyl cellulose having an alkyl group having 1 to 8 carbon atoms, such as methyl cellulose or ethyl cellulose, polyalkylene carbonate having an alkylene unit having 1 to 8 carbon atoms, such as polypropylene carbonate or polyethylene carbonate, or a polyvinyl alcohol-based binder, such as polyvinyl alcohol or polyvinyl acetate, but may not be limited thereto.

After forming the slurry to contain the metal powder, the dispersant, and the binder as described above, the slurry may be injected into a mold having a predetermined shape or coated on a substrate to form the metal foam precursor.

The metal foam precursor thus formed may be formed into the porous member 310 through the sintering process.

In this case, conditions of the sintering process are not particularly limited as long as the sintering process is performed at a temperature and for a time at which a solvent contained in the slurry may be removed to a desired level. For example, the sintering may be performed in a temperature range from about 50° C. to 250° C. for a predetermined time. However, the disclosure may not be limited thereto.

The cushion plate 300 may be formed by placing the adhesive member 320 on an upper surface of the porous member 310 after forming the porous member 310.

Alternatively, the metal foam precursor may be formed on the adhesive member 320 and may be sintered to form the porous member 310 and the cushion plate 300. Thus, a scheme for manufacturing the cushion plate 300 is not particularly limited.

The adhesive member 320 may be in contact with the reinforcing plate 200, and may fix the cushion plate 300 to the reinforcing plate 200 or the display panel 100. For example, the adhesive member 320 may be in direct contact with the reinforcing plate 200.

The adhesive member 320 may be made of or include a material such as PSA (Pressure Sensitive Adhesive), OCA (Optical Clear Adhesive), or OCR (Optical Clear Resin). The PSA (Pressure Sensitive adhesive) may be a viscoelastic adhesive that may be adhered even under a weakly applied pressure.

For example, the adhesive member 320 may be made of one or more of an acrylic-based, silicone-based, epoxy-based, or urethane-based materials having an adhesive component. The present disclosure is not limited thereto.

The adhesive member 320 may have a predetermined thickness and be composed of one layer, or may be formed in a multi-layer structure in which an adhesive layer is formed on each of a bottom and a top of a base substrate. An embossed pattern as an unevenness structure may be formed on an upper surface of the adhesive member 320, thereby preventing occurrence of air bubbles due to the adhesive member.

Figure 5:
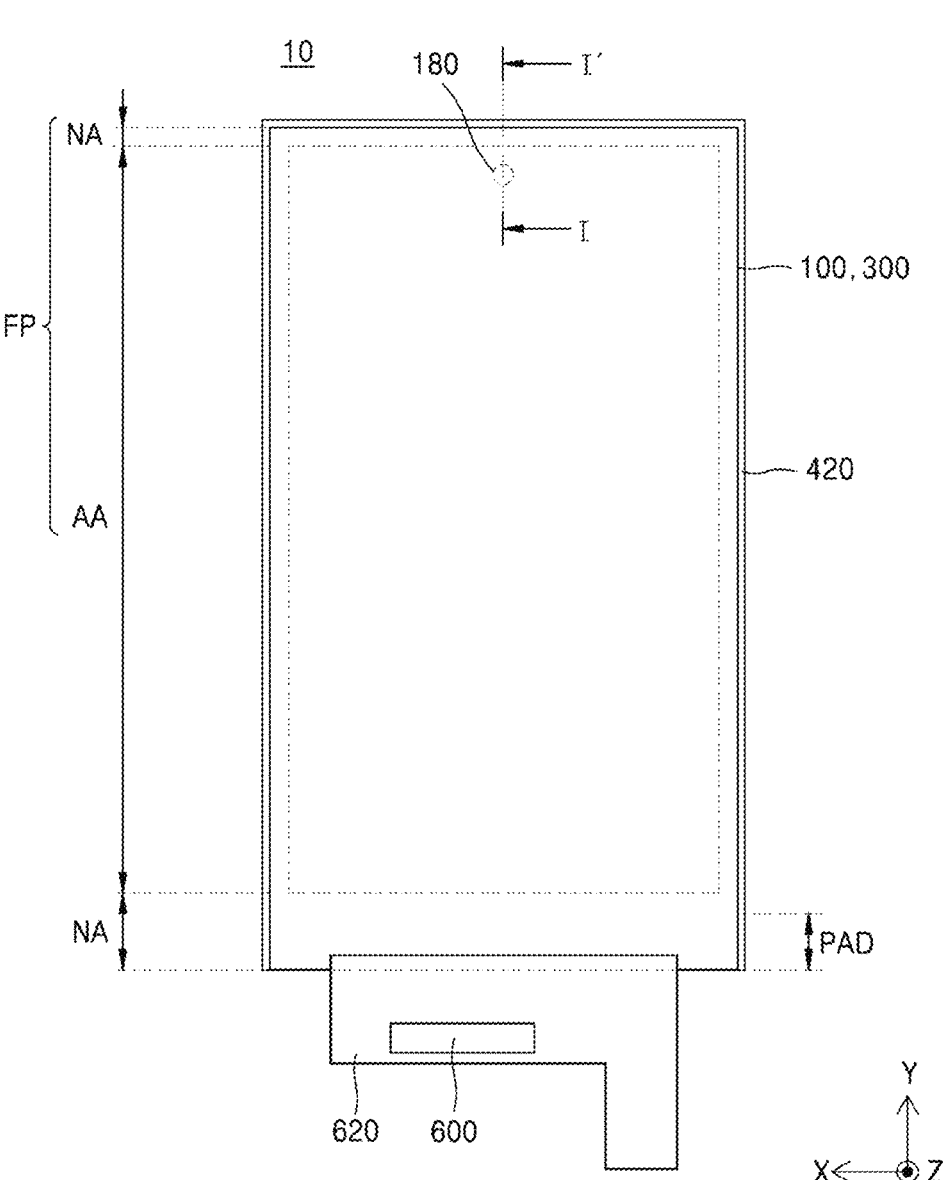
FIG. 5 is a plan view showing a front side of a display apparatus according to an embodiment of the present disclosure.

FIG. 4 is a diagram showing a method for forming a hole in a display apparatus according to an embodiment of the present disclosure. FIG. 5 is a plan view showing a front side of a display apparatus according to an embodiment of the present disclosure.

To form the hole 180 in the display apparatus 10, the cushion plate 300 may be attached to the display panel 100, and then an area of the hole 180 of each of the display panel 100 and the cushion plate 300 may be removed using a laser device 700.

When the reinforcing plate 200 is disposed between the display panel 100 and the cushion plate 300 so as to keep the display panel 100 flat, an area of the hole 180 of the reinforcing plate 200 may also be cut using the laser device 700.

According to an embodiment of the present disclosure, a first coating 400 made of a conductive material may be formed on a surface of the hole 180 extending through the display panel 100 and the porous member 310.

To form the first coating 400 on the surface of the hole 180, the display panel 100 and the cushion plate 300 are turned upside down so that the cushion plate 300 faces upwards, and then a laser beam of the laser device 700 is irradiated to the porous member 310, such that the first coating 400 together with the hole 180 extending through the display panel 100 and the cushion plate 300 may be formed.

When the laser beam to form the hole 180 is irradiated to the porous member 310, the porous member 310 made of the metal may be melted, and the molten metal may flow down from the portion of the hole 180 extending through the porous member 310 to a portion of the hole 180 extending through the optical plate 140 of the display panel 100. When the flowing-down molten metal is solidified, the first coating 400 made of the metal of the porous member 310 may be formed on the surface of the hole 180. Thus, in some embodiments, the first coating 400 may be disposed on the side surface of a display structure (for example, including the display panel 100 or the reinforcing plate 200) or on the side surface of the cushion plate 300. The first coating 400 may include the conductive material included in the porous member 310 of the cushion plate 300.

For example, the display panel 100 and the porous member 310 may be adhered to each other via the adhesive member 320, and then, the display panel 100 and the porous member 310 may be partially removed with the laser device 700 to form the hole 180 and the first coating 400.

The first coating 400 may move the electric charge or electric field generated in the process of removing the protective film attached to protect the display panel 100 and the cushion plate 300 or the manufacturing process of the display panel 100 and the cushion plate 300 toward the porous member 310, thereby dispersing or discharging the electric charge or electric field.

A second coating 420 may be formed on distal ends of the display apparatus 10 so as to disperse and discharge the electric charge or electric field generated from the back surface of the cover member 20 and the side surface of the display panel 100 toward the porous member 310.

The second coating 420 may be disposed on three distal ends of the display panel 100 and the porous member 310, that is, the upper side end, the left side end, and the right side end.

Each of the upper, right and left distal ends in the plan view (defined by the X-axis and Y-axis) of the display apparatus 10 may have a step in the process of stacking several components. In order to remove the step, a portion of the distal ends of the display apparatus 10 may be cut with the laser device 700.

In the display apparatus 10 in which a portion of the distal ends are removed, the distal ends of the display panel 100, the reinforcing plate 200, and the cushion plate 300 may coincide with each other. That is, portions of the distal ends of the display panel 100, the reinforcing plate 200, and the cushion plate 300 may be cut together and at the same time, so that the distal ends of the display panel 100, the reinforcing plate 200, and the cushion plate 300 of the display apparatus 10 may be aligned with each other without a protruding step. Therefore, a second interface between a display structure (including the display panel 100 or the reinforcing plate 200) and the cushion plate 300 at a distal end of the display apparatus 10 may be flush with each of a second side surface of the display structure and a second side surface of the cushion plate 300 at the distal end, where the distal end may be one or more of a left end, right end, upper end, or lower end of the display apparatus 10.

Since the bending portion or the pad portion PAD may be disposed at the lower side of the display apparatus 10, cutting of the lower side (lower distal end) of the display apparatus 10 may be omitted. The three distal ends, that is, the upper side, the left side and the right side of each of the display panel 100 and the porous member 310 may be cut so that the distal ends, that is, the upper sides of the display panel 100 and the porous member 310 coincide with each other, the left sides of the display panel 100 and the porous member 310 coincide with each other, and the right sides of the display panel 100 and the porous member 310 coincide with each other.

When the distal ends of the layers of the display apparatus 10 are aligned with each other without a step, there is no protrusion, thereby reducing the damage of the display panel due to the external impact and preventing moisture permeation.

When a laser beam is irradiated to cut the distal ends of the display apparatus 10, the porous member 310 made of the metal may be melted, and the molten metal may flow down from the porous member 310 to the display substrate 110 of the display panel 100, such that the second coating 420 may be formed on the side surfaces of the distal ends of the display apparatus 10. Thus, in some embodiments, the second coating 420 may be disposed on the second side surface of the display structure or on the second side surface of the cushion plate 300 at a distal end of the display apparatus 10.

The second coating 420 may move the electric charge or electric field generated on the side surfaces of the cover member 20 and the display panel 100 to the porous member 310 to discharge the electric charge or electric field.

When the discharge member 800 made of a film or a conductive polymer compound is connected to and disposed between the second coating 420 and the back surface of the cover member 20, the electric charge or electric field may be more effectively moved and thus discharged to the porous member 310.

Figure 6:
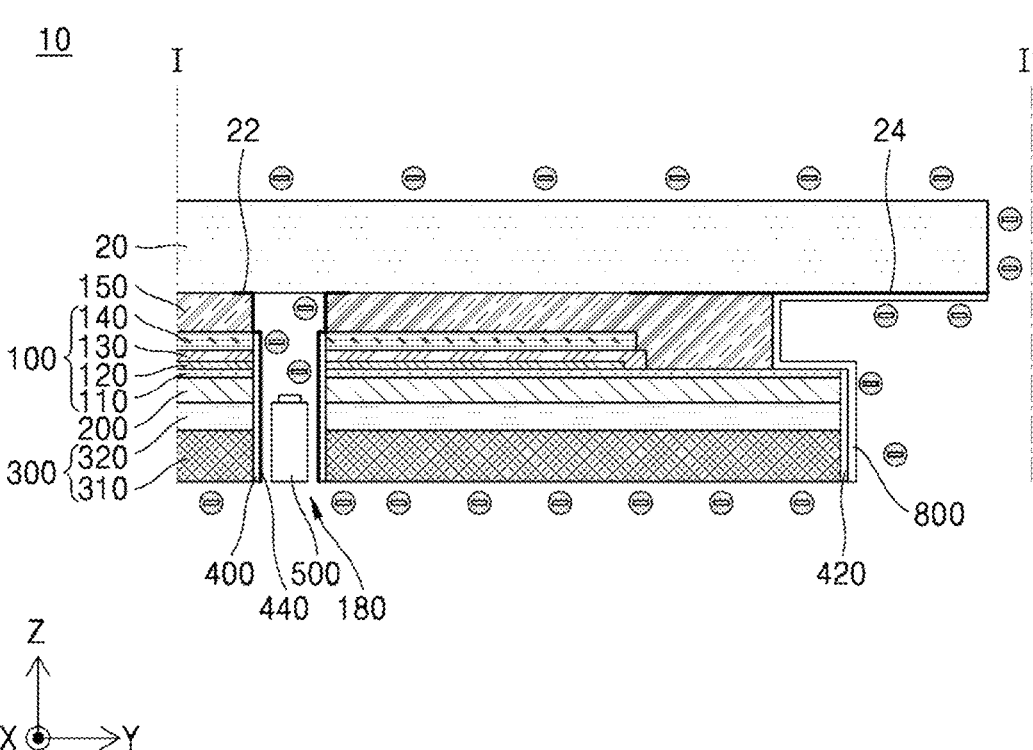
FIG. 6 is a diagram of a cross-sectional view along I-I' in FIG. 5 according to another embodiment of the present disclosure.

FIG. 6 shows another embodiment of the present disclosure, and is a cross-sectional view along I-I' in FIG. 5.

Referring to FIG. 6, a camera module 500 or various sensor devices are received in the hole 180 of the display apparatus 10. The electric charge or electric field generated in the process of forming the display apparatus 10 and the hole 180 may be discharged through the first coating 400 to the porous member 310, thereby preventing damage to the camera module 500 or various sensor devices due to the electric charges or electric field.

Further, since the electric charge or electric field may move through the first coating 400, it is possible to prevent the phenomenon that the area around the hole 180 in the display panel 100 emits brighter light.

Moreover, the second coating 420 formed on the side surface of the distal end of the display apparatus 10 may discharge the electric charge generated due to the friction between the cover member and an external object or the electric charge generated from the outside toward the porous member 310, thereby preventing the phenomenon that the edge area of the display panel 100 emits brighter light.

A black ink portion 440 may be additionally applied to a surface of the first coating 400.

The first coating 400 may be formed of the metal. Thus, light incident from the outside may be reflected from the first coating 400. When the light reflected from the first coating is incident on the camera module, a light-leakage phenomenon may occur in which the edge portion of the image captured by the camera module or an entirety of the image is displayed in a brighter manner.

Therefore, in order to prevent the external light from being reflected from the first coating 400, the black ink portion 440 may be applied to the surface of the first coating 400 so as to prevent the light-leakage.

The black ink portion 440 may be made of a black material, and thus may absorb the external light. A conductive polymer compound may be added to the black ink portion 440 such that the black ink portion 440 together with the first coating 400 may transfer the electric charges.

The black ink portion 440 may be formed across an entire area of the hole 180, and may be connected to the first light-blocking portion 22. This may completely block the external light incident in the oblique direction, thereby preventing the light-leakage phenomenon of the camera module.

According to an embodiment of the present disclosure, when the laser device 700 is not used to form the hole 180 of the display apparatus 10, the first coating 400 may not be formed on the surface of the hole 180. The black ink portion 440 may be directly disposed on the surface of the hole 180 where the first coating 400 is not formed. Therefore, in some embodiments, the first coating 400 is not disposed on at least a portion of the side surface of the display structure within the hole 180 or the second coating 420 is not disposed on at least a portion of the second side surface of the display structure at a distal end, and the black ink portion 440 may directly contact the side surface or the second side surface of the display structure without coating material therebetween.

According to an embodiment of the present disclosure, a display apparatus comprises a display panel to display an image; and a porous member disposed under the display panel, wherein a hole extends through the display panel and the porous member, wherein a portion of the hole extending through the display panel and a portion of the hole extending through the porous member are disposed in the same area in a plan view of the apparatus.

In some embodiments of the apparatus, a diameter of the portion of the hole extending through the display panel and a diameter of the portion of the hole extending through the porous member are equal to each other.

In some embodiments of the apparatus, at least one of a first coating or a black ink portion is disposed on each of a surface defining the portion of the hole extending through the display panel and a surface defining the portion of the hole extending through the porous member.

In some embodiments of the apparatus, in the plan view of the apparatus, upper side surfaces of the display panel and the porous member coincide with each other, left side surfaces of the display panel and the porous member coincide with each other, and right side surfaces of the display panel and the porous member coincide with each other.

In some embodiments of the apparatus, a second coating is disposed on upper, right and left side surfaces of each of the display panel and the porous member in the plan view of the apparatus.

In some embodiments of the apparatus, the apparatus further comprises a cover member disposed on an upper surface of the display panel so as to protect the display panel, wherein a back surface of the cover member and the second coating are connected to each other via an electric charge discharge member.

In some embodiments of the apparatus, the apparatus further comprises: a cover member disposed on a upper surface of the display panel to protect the display panel: a connection member disposed between the display panel and the cover member; and a reinforcing plate disposed between the display panel and the porous member, wherein the hole extends through the connection member and the reinforcing plate.

In some embodiments of the apparatus, the porous member includes a conductive metal and a plurality of pores formed inside the conductive metal.

According to an embodiment of the present disclosure, a method for manufacturing a display apparatus comprises adhering a display panel displaying an image and a porous member to each other via an adhesive member; and cutting the display panel and the porous member using a laser device, thereby forming a hole and a first coating on a surface of the hole.

In some embodiments of the method, the method further comprises forming a black ink portion on a surface of the first coating.

Although the embodiments of the present disclosure have been described above in more detail with reference to the accompanying drawings, the present disclosure is not necessarily limited to the embodiments, and various modifications may be made within the scope that does not deviate from the technical spirit of the present disclosure. Therefore, the embodiments as disclosed in the present disclosure are to illustrate the disclosure rather than limiting the technical idea of the present disclosure, and the scope of the technical idea of the present disclosure is not limited to the embodiments. Therefore, it should be understood that the embodiments as described above are illustrative in all respects and not restrictive. The protective scope of the present disclosure should be interpreted based on the claims, and all technical ideas within the scope equivalent thereto should be construed as being included in the scope of the present disclosure.

What is claimed is:

1. A display apparatus comprising:
a display panel to display an image;
a porous member disposed under the display panel;
a hole extending through the display panel and the porous member, wherein a portion of the hole extending through the display panel and a portion of the hole extending through the porous member are disposed in a same area in a plan view of the display apparatus;
a first coating disposed on a surface of the hole extending through the display panel and the porous member; and
a second coating directly and continuously disposed on an upper end, a right end, and a left end of each of the display panel and the porous member,
wherein the porous member includes a conductive metal, and both the first coating and the second coating are made only of the same conductive metal as the porous member.

2. The display apparatus of claim 1, wherein a diameter of the portion of the hole extending through the display panel and a diameter of the portion of the hole extending through the porous member are equal to each other.

3. The display apparatus of claim 1, further comprising a black ink portion disposed on the first coating within the hole.

4. The display apparatus of claim 1, wherein three side surfaces of the display panel and the porous member coincide with each other.

5. The display apparatus of claim 1, wherein the display apparatus further comprises a cover member disposed on an upper surface of the display panel so as to protect the display panel,
wherein a back surface of the cover member and the second coating are connected to each other via a discharge member.

6. The display apparatus of claim 1, wherein the display apparatus further comprises:
a cover member disposed on an upper surface of the display panel to protect the display panel;
a connection member disposed between the display panel and the cover member; and
a reinforcing plate disposed between the display panel and the porous member,
wherein the hole extends through the connection member and the reinforcing plate.

7. A display apparatus comprising:
a display structure including at least a display panel for displaying an image;
a cushion plate disposed under the display structure, the cushion plate including at least a porous member formed with a plurality of pores and including a conductive metal, wherein a hole extends through the display structure and the cushion plate to expose a side surface of the display structure and a side surface of the cushion plate within the hole; and a first coating disposed on the side surface of the display structure or on the side surface of the cushion plate, a second coating directly and continuously disposed on a second side surface of the display structure or on a second side surface of the cushion plate at a distal end of the display apparatus, wherein the distal end is at least one of a left end, a right end, an upper end, or a lower end of the display apparatus, wherein both the first coating and the second coating are made only of the same conductive metal as the porous member.

8. The display apparatus of claim 7, wherein the display structure includes a reinforcing plate below the display panel and the hole also extends through the reinforcing plate to expose a side surface of the reinforcing plate within the hole, and wherein the first coating is disposed on the side surface of the reinforcing plate.

9. The display apparatus of claim 7, further comprising a black ink portion on the first coating.

10. The display apparatus of claim 9, further comprising:

a cover member disposed on the display panel, wherein a first light-blocking portion is formed on a back surface of the cover member in an area surrounding the hole, and wherein the black ink portion is electrically connected to the first light-blocking portion.

11. The display apparatus of claim 9, wherein the first coating is not disposed on at least a portion of the side surface of the display structure, and the black ink portion directly contacts the portion of the side surface of the display structure without the first coating therebetween.

12. The display apparatus of claim 7, wherein the conductive metal includes at least one of chromium (Cr), iron (Fe), copper (Cu), nickel (Ni), or a combination thereof.

\* \* \* \* \*